(12) United States Patent
Ishizaka et al.

(10) Patent No.: US 9,064,690 B2
(45) Date of Patent: Jun. 23, 2015

(54) METHOD FOR FORMING CU WIRING

(71) Applicant: TOKYO ELECTRON LIMITED, Minato-ku (JP)

(72) Inventors: Tadahiro Ishizaka, Yamanashi (JP); Atsushi Gomi, Yamanashi (JP); Kenji Suzuki, Yamanashi (JP); Tatsuo Hatano, Yamanashi (JP); Hiroyuki Toshima, Yamanashi (JP); Yasushi Mizusawa, Tokyo (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 0 days.

(21) Appl. No.: 13/962,327

(22) Filed: Aug. 8, 2013

(65) Prior Publication Data
US 2014/0045329 A1  Feb. 13, 2014

(30) Foreign Application Priority Data
Aug. 8, 2012  (JP) ................ 2012-176422

(51) Int. Cl.
*H01L 21/768* (2006.01)
*H01L 21/02* (2006.01)
(Continued)

(52) U.S. Cl.
CPC ...... *H01L 21/02104* (2013.01); *H01L 21/2855* (2013.01); *H01L 23/53238* (2013.01); *H01L 21/76834* (2013.01); *H01L 21/76843* (2013.01); *H01L 21/76849* (2013.01); *H01L 21/76855* (2013.01); *H01L 21/76876* (2013.01); *H01L 21/312* (2013.01); *H01L 21/76877* (2013.01); *H01L 21/28556* (2013.01)

(58) Field of Classification Search
CPC ............... H01L 21/26877; H01L 21/28556; H01L 21/76831; H01L 21/76843; H01L 21/76873; H01L 21/76877; H01L 21/76849; H01L 21/3212; H01L 21/7684
USPC .............. 438/622–629, 631–633, 687; 257/E21.576
See application file for complete search history.

(56) References Cited

U.S. PATENT DOCUMENTS 7,799,681 B2   9/2010   Suzuki et al.
2008/0200002 A1   8/2008   Suzuki et al.
(Continued)

FOREIGN PATENT DOCUMENTS

JP   2006-148075   6/2006
JP   2011-23456    2/2011
(Continued)

OTHER PUBLICATIONS

T. Nogami et al. "High Reliability 32nm Cu/ULK BEOL Based on PVD CuMn Seed, and its Extendibility", IEEE 2010, 4 pages.

*Primary Examiner* — Thanhha Pham
(74) *Attorney, Agent, or Firm* — Oblon, McClelland, Maier & Neustadt, L.L.P.

(57) ABSTRACT

A Cu wiring forming method forms Cu wiring in a recess of a predetermined pattern including a trench formed in an insulating film on a substrate surface. The method includes: forming a barrier film at least on a surface of the recess; forming a Cu film by PVD to fill the recess with the Cu film; forming an additional layer on the Cu film; polishing an entire surface by CMP to form the Cu wiring in the recess; forming a metal cap including a manganese oxide film on an entire surface including the insulating film and the Cu wiring of the substrate after performing the CMP polishing; and forming a dielectric cap on the metal cap.

7 Claims, 14 Drawing Sheets

(51) Int. Cl.
 *H01L 21/285* (2006.01)
 *H01L 23/532* (2006.01)
 *H01L 21/312* (2006.01)

(56) References Cited

U.S. PATENT DOCUMENTS

2009/0263965 A1  10/2009  Gordon et al.
2010/0081274 A1   4/2010  Ishizaka et al.
2012/0091588 A1*  4/2012  Miyoshi .................. 257/751
2012/0114869 A1   5/2012  Miyoshi et al.

FOREIGN PATENT DOCUMENTS

JP     2012-504347       2/2012
WO   WO 2012/060428 A1  5/2012

* cited by examiner

PREPROCESSING

MnO₂ FILM FORMATION

PREPROCESSING

Mn FILM FORMATION

Mn FILM OXIDATION

- • 60 nm (NO MnO₂ CAP EXIST)
- ○ 60 nm (MnO₂ CAP EXIST)
- • 80 nm (NO MnO₂ CAP EXIST)
- ○ 80 nm (MnO₂ CAP EXIST)

NO MnO$_2$ CAP EXIST

MnO$_2$ CAP EXIST

METHOD FOR FORMING CU WIRING

CROSS-REFERENCE TO RELATED APPLICATION

This application claims priority to Japanese Patent Application No. 2012-176422 filed on Aug. 8, 2012, the entire contents of which are incorporated herein by reference.

FIELD OF THE INVENTION

The present invention relates to a Cu wiring forming method for forming Cu wiring in a recess such as a trench formed on a substrate.

BACKGROUND OF THE INVENTION

In a semiconductor device manufacturing process, a desired device is manufactured by repetitively performing various processes such as film formation, etching and the like on a semiconductor wafer. Recently, in order to meet the demands for a high-speed semiconductor device, wiring pattern miniaturization and high-integration, it has been required to realize low resistance of wiring (high conductivity) and high electromigration tolerance.

Accordingly, Cu having high electromigration tolerance and higher conductivity (lower resistance) than Al or W has been used as a wiring material.

As for the Cu wiring forming method, there is suggested a technique for forming a barrier film formed of Ta, Ti, TaN, TiN or the like on an entire interlayer insulating film having a recess such as a trench or a hole by plasma sputtering as PVD (Physical Vapor Deposition), forming a Cu seed layer on the barrier film by plasma sputtering, filling a trench or a hole by performing Cu plating, and removing a residual Cu thin film or a residual barrier film from the wafer surface by CMP (Chemical Mechanical Polishing) (see, e.g., Patent Document 1).

However, as the current density is increased along with the miniaturization of the design rules of semiconductor devices, sufficient electromigration tolerance is not obtained even by using Cu as the wiring material. Therefore, a technique is examined for improving the electromigration tolerance of the Cu wiring.

As for such technique, there is suggested a technique for improving adhesivity between Cu and a dielectric cap (SiCN cap) formed thereon by concentrating an alloy content such as Mn, Al or the like between the Cu wiring and the dielectric cap by using a Cu alloy such as Cu—Mn, Cu—Al or the like as a seed layer, instead of the Cu seed layer (see, e.g., Non-Patent Document 1) or a technique for improving adhesivity between Cu and the dielectric cap by selectively forming a metal cap on a surface of Cu wiring (see, e.g., Patent Documents 2 to 4).

PATENT DOCUMENTS

Patent Document 1: Japanese Patent Application Publication No. 2006-148075
Patent Document 2: Japanese Patent Application Publication No. 2011-023456
Patent Document 3: U.S. Pat. No. 7,799,681
Patent Document 4: Japanese Unexamined Patent Application Publication No. 2012-504347

NON-PATENT DOCUMENT

Non-Patent Document 1: Nogami et. al. IEDM2010 pp 764-767

Thus, along with the trend toward the miniaturization of the design rules of the semiconductor devices, a trench width or a hole diameter is several tens of nm. When a barrier film or a seed film is formed by plasma sputtering in a recess such as a narrow trench or a narrow hole and, then, the trench or the hole is filled by Cu plating as described in Patent Document 1 or Non-Patent Document 1, a void is formed due to insufficient fillability. Accordingly, the technique of Non-Patent Document 1 may improve the electromigration tolerance but is insufficient to deal with the recent miniaturization of the design rules.

Referring to Patent Documents 2 to 4, the metal cap is selectively formed on the Cu wiring in order to reduce a leak current between wirings. However, the process becomes too complicated to ensure selectivity. Further, when the metal cap is formed on the insulating film due to lack of selectivity, the leak current between the wirings is increased.

SUMMARY OF THE INVENTION

In view of the above, the present invention provides a Cu wiring forming method capable of forming a Cu wiring having high electromigration tolerance without forming a void or the like when forming a Cu wiring in a recess including a trench and without the complicated process or increase of a leak current between wirings.

In accordance with an aspect of the present invention, there is provided a Cu wiring forming method for forming a Cu wiring in a recess of a predetermined pattern which includes a trench formed in an insulating film on a substrate. The method includes: forming a barrier film at least on a surface of the recess; forming a Cu film by PVD to fill the recess with the Cu film; forming an additional layer on the Cu film; polishing an entire surface of the substrate by CMP to form the Cu wiring in the recess; forming a metal cap formed of a manganese oxide film on an entire surface including the insulating film and the Cu wiring of the substrate after the CMP polishing; and forming a dielectric cap on the metal cap.

The forming the metal cap may include forming the manganese oxide film by PVD, CVD or ALD. Further, the forming the metal cap may include: forming a Mn film by PVD, CVD or ALD; and forming the manganese oxide film by oxidizing the Mn film.

In accordance with another aspect of the present invention, there is provided a Cu wiring forming method for forming a Cu wiring in a recess of a predetermined pattern which includes a trench formed in an insulating film on a substrate. The method includes: forming a barrier film at least on a surface of the recess; forming a Cu film by PVD to fill the recess with the Cu film; forming an additional layer on the Cu film; polishing an entire surface of the substrate by CMP to form the Cu wiring in the recess; forming a Mn film on an entire surface including the insulating film and the Cu wiring of the substrate after the CMP polishing and annealing the Mn film to form a metal cap including a self-aligned insulating film formed on the insulating film and the Mn film formed on the Cu wiring; and forming a dielectric cap on the metal cap.

The Cu wiring forming method may further include forming an Ru film between said forming the barrier layer and said forming the Cu film, and the Ru film is preferably formed by CVD.

The Cu film may be formed by an apparatus configured to generate a plasma from a plasma generation gas in a processing chamber where a substrate is accommodated, scatter elements emitted from a target formed of Cu, ionize the elements in the plasma and attract the ions onto the substrate by applying a bias power to the substrate.

The additional layer is preferably formed by forming a Cu film by PVD.

The barrier film is preferably selected from a group consisting of a Ti film, a TiN film, a Ta film, a TaN film, a Ta/TaN bilayered film, a TaCN film, a W film, a WN film, a WCN film, a Zr film, a ZrN film, a V film, a VN film, a Mb film, and a NbN film.

In accordance with still another aspect of the present invention, there is provided a storage medium storing a program to be executed in a computer. The program controls, when executed, a Cu wiring forming system to perform the Cu wiring forming method described above.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENTS

Hereinafter, an embodiment of the present invention will be described with reference to the accompanying which form a part hereof.

<Embodiment of the Cu Wiring Forming Method>

Figure 1:
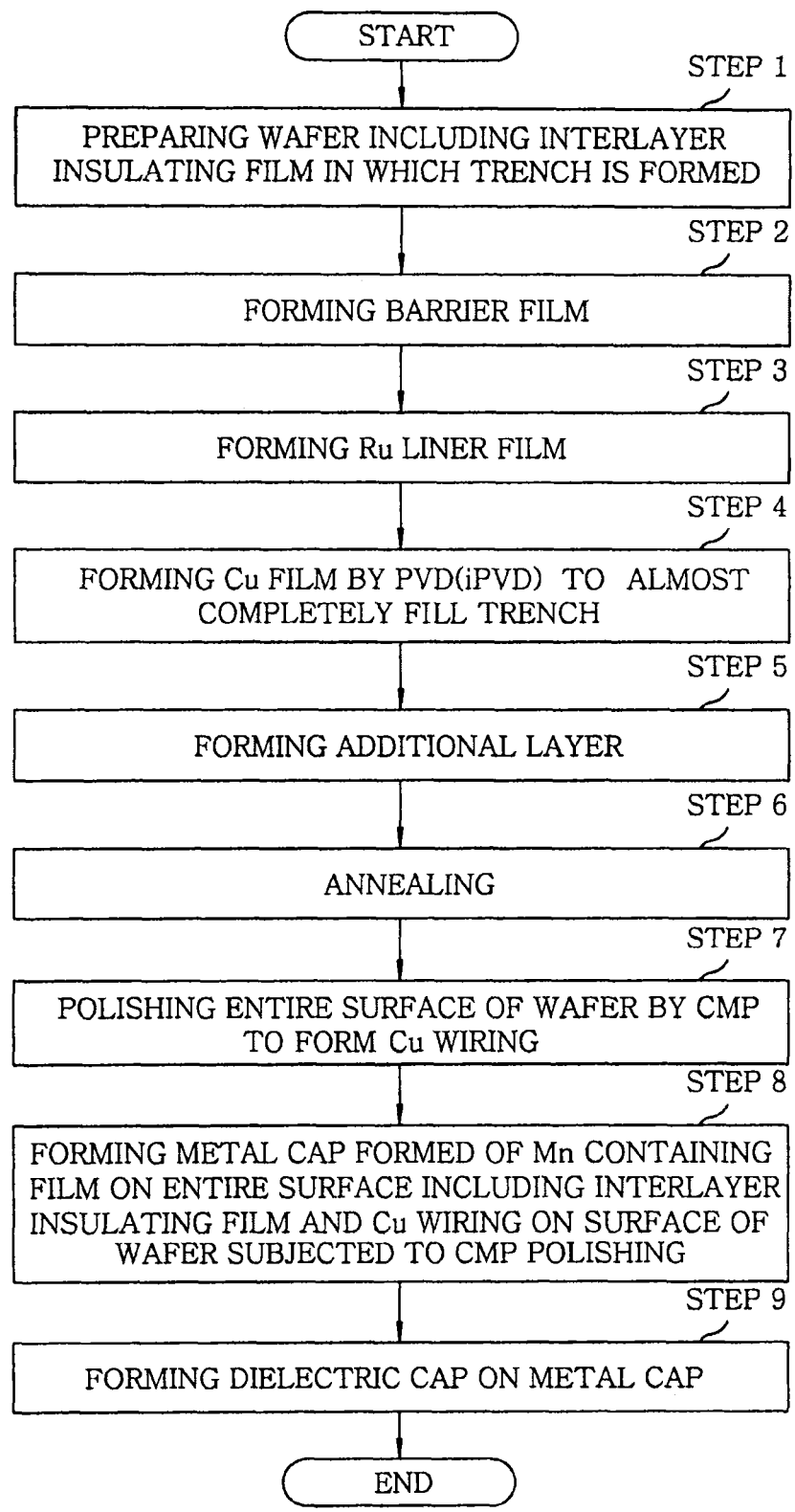
FIG. 1 is a flowchart showing a Cu wiring forming method in accordance with an embodiment of the present invention.

First, an embodiment of the Cu wiring forming method will be described with reference to the flowchart in FIG. 1 and the process cross sectional view in FIGS. 2A to 2H.

Figure 2A:
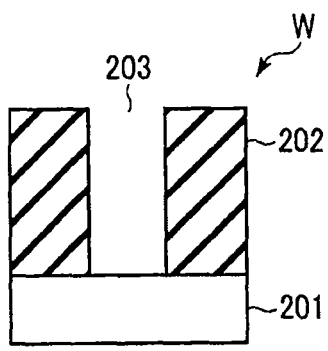
FIGS. 2A to 2H are a process cross sectional views for explaining the Cu wiring forming method in accordance with the embodiment of the present invention.

In the present embodiment, first, there is provided a semiconductor wafer (hereinafter, simply referred to as "wafer") W including: a base structure 201 (detailed description thereof is omitted); an interlayer insulating film 202 such as a $SiO_2$ film, a low-k film (SiCO, SiCOH and the like) or the like formed on the base structure 201; and a trench 203 and a via (not shown) for connection with lower wiring, formed in a predetermined pattern (step 1, FIG. 2A). In this wafer W, it is preferable that moisture or etching/ashing residue has been removed from the surface of the insulating film by a degas process or a pre-clean process.

Figure 2B:
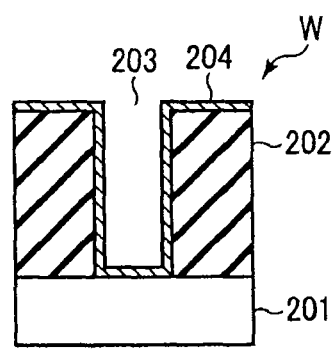

Next, a barrier film 204 for suppressing diffusion of Cu by shielding Cu (acting as a barrier against Cu) is formed on the entire surface including the surface of the via and the trench 203 (step 2, FIG. 2B).

As for the barrier film 204, it is preferable to use a film having a high barrier property and a low resistance, e.g., a Ti film, a TiN film, a Ta film, a TaN film, or a Ta/TaN bilayered film. It is also possible to use a TaCN film, a W film, a WN film, a WCN film, a Zr film, a ZrN film, a V film, a VN film, a Nb film, a NbN film or the like. The Cu wiring has a lower resistance as the volume of Cu filled in the trench or the hole is increased. Therefore, the barrier film preferably has a considerably thin thickness in a range from, e.g., about 1 nm to 20 nm, and more preferably in a range from about 1 nm to 10 nm. The barrier film can be formed by ionized PVD (ionized Physical Vapor Deposition; iPVD), e.g., plasma sputtering. It can also be formed by another PVD such as conventional sputtering, ion plating or the like; CVD or ALD; or CVD or ALD using a plasma.

Figure 2C:
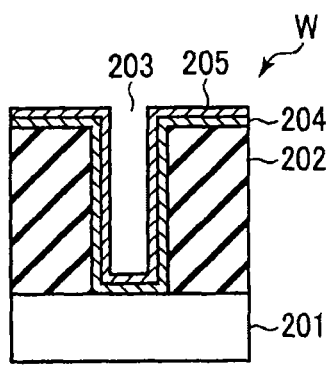

Next, a Ru liner film 205 is formed on the barrier film 204 (step 3, FIG. 2C). The Ru liner film preferably has a thin thickness in a range from, e.g., about 1 nm to 5 nm, in order to realize a low resistance of wiring by increasing the filling volume of Cu.

Ru has high wettablitiy with Cu. By forming the Ru liner film at the base of Cu, good mobility of Cu can be ensured in forming a Cu film by iPVD, and an overhang which blocks the opening of the trench or the hole hardly occurs. Therefore, Cu can be reliably filled in a fine trench or hole without forming a void in therein.

The Ru liner film is preferably formed by thermal CVD while using $Ru_3(CO)_{12}$ as a film forming material. Accordingly, a thin Ru film having high purity can be formed with a high step coverage. The film forming conditions of the Ru liner film are as follows: a pressure in the processing chamber ranging from about 1.3 Pa to 66.5 Pa; and a film forming temperature (wafer temperature) ranging from about 150° C. to 250° C. The Ru liner film 205 may be formed by PVD such as sputtering or the like, or CVD using another film forming material other than $Ru_3(CO)_{12}$, such as a ruthenium pentadienyl compound, e.g., (cyclopentadienyl) (2,4-dimethylpentadienyl)ruthenium, bis(cyclopentadienyl) (2,4-methylpentadienyl)ruthenium, (2,4-dimethylpentadienyl) (ethylcyclopentadienyl)ruthenium, or bis(2,4-methylpentaenyl)(ethylcyclopentadienyl)ruthenium.

Further, when the opening of the trench or the via is wide and the occurrence of an overhang is hindered, it is not necessary to form the Ru liner film 205, and a Cu film may be directly formed on the barrier film 204.

Figure 2D:
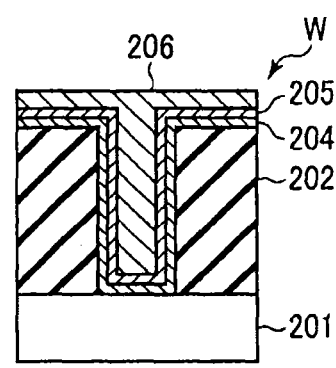

Next, a Cu film 206 is formed by PVD to fill the trench 203 and the via (not shown) almost completely (step 4, FIG. 2D). The film formation at that time is preferably performed by iPVD, e.g., plasma sputtering.

In conventional PVD film formation, the overhang that blocks the opening of the trench or the hole easily occurs due to an agglomeration of Cu. However, the generation of an overhang can be suppressed by moving Cu by controlling the film formation by Cu ions and the etching by ions (Ar ions) of the plasma generation gas while using iPVD and adjusting the bias power applied to the wafer. Accordingly, good fillability can be obtained even in a trench or a hole having a narrow opening. At this time, it is preferable to perform a high-temperature process (in a temperature ranging from about 65° C. to 350° C.) in which Cu is migrated in order to ensure mobility of Cu and obtain good fillability. Further, as described above, by providing the Ru liner film 205 having high wettability to Cu below the Cu film 206, Cu moves without agglomeration on the Ru liner film 205. Accordingly, the generation of overhang can be suppressed even in the fine recess, and Cu can be reliably filled without forming a void.

When the overhang hardly occurs due to a large opening width of a trench or a hole, the film formation can be performed at a high speed by a low-temperature process (in a temperature ranging from −50° C. to 0° C.) in which Cu does not migrate.

During the formation of the Cu film 206, the pressure in the processing chamber (processing pressure) is preferably in a range from, e.g., about 1 mTorr to 100 mTorr (from about 0.133 Pa to 13.3 Pa) and more preferably in a range from, e.g., about 35 mTorr to 90 mTorr (in a range from about 4.66 Pa to 12.0 Pa).

Figure 2E:
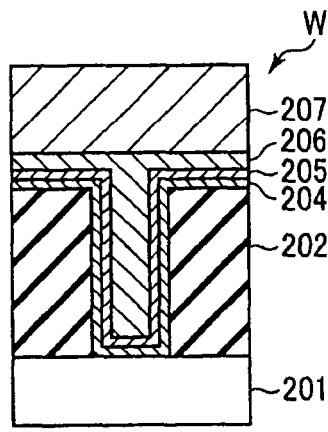
Figure 2F:
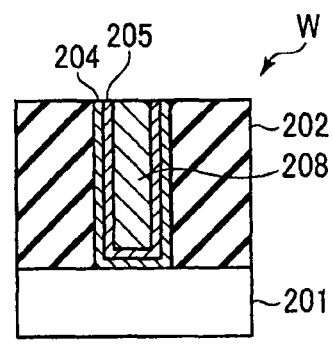

After Cu is filled in the trench 203 and the via (hole), an additional layer 207 is formed on the Cu film 206 in preparation for a planarization process to be performed later (step 5, FIG. 2E).

Upon completion of the Cu film 206, the additional layer 207 may be formed by forming a Cu film by PVD such as iPVD or the like, or may be formed by plating. However, in order to obtain good throughput and simplify the apparatus, it is preferable to form the additional layer 207 by using the same PVD (iPVD) apparatus as that used for forming the Cu film 206. In the case of forming the additional layer 207 by PVD, the additional layer 207 is preferably formed at a high film forming rate compared to the Cu film 206 because fillability is hardly considered.

After the additional layer 207 is formed, an annealing process is performed if necessary (step 6). Due to the annealing process, the Cu film 206 is stabilized.

Next, the entire surface of the wafer W is polished by CMP (Chemical Mechanical Polishing). As a result, the additional layer 207, the Cu film 206, the Ru liner film 205, and the barrier film 204 are removed, and the wafer surface is planarized (step 7, FIG. 2F). As a result, a Cu wiring 208 is formed in the trench and the via (hole).

Figure 2G:
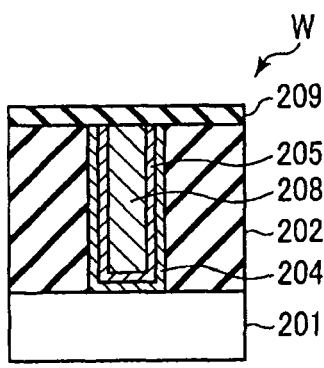

Thereafter, a metal cap 209 formed of an Mn containing film which will be described below is formed on the entire surface including the interlayer insulating film 202 and the Cu wiring 208 of the wafer W subjected to the CMP polishing (step 8, FIG. 2G).

Figure 2H:
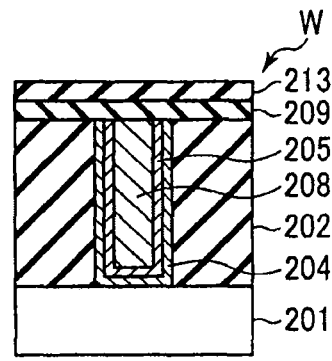

After the metal cap 209 is formed, a dielectric cap 213 made of, e.g., SiCN, is formed thereon (step 9, FIG. 2H). The dielectric cap 213 may be formed by CVD.

As will be described in the following, the metal cap 209 formed of the Mn containing film used in the present embodiment provides the effect of improving the electromigration tolerance of Cu by improving the adhesivity between the Cu wiring 208 and a dielectric cap 213, as in the case of the conventional metal cap. As will be described in the following, unlike the conventional metal cap, the metal cap 209 formed of the Mn containing film does not require selectivity to the Cu wiring 208 in the film formation step and can be formed on the entire surface.

The metal cap 209 formed of the Mn containing film can be formed by the following first to third methods.

(First Method)

Figure 3A:
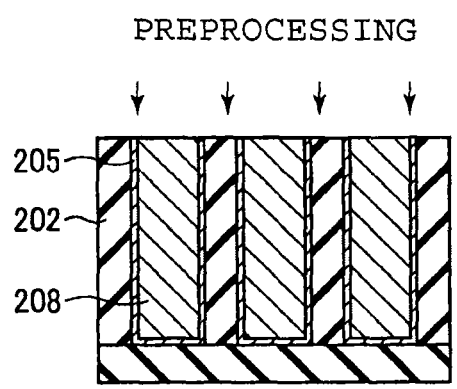
FIGS. 3A and 3B are process cross sectional views for explaining a first method of a metal cap forming process.
Figure 3B:
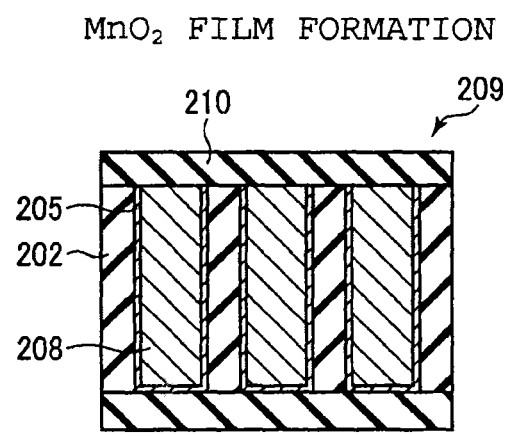

A first method will be described with reference to FIGS. 3A and 3B. In FIGS. 3A and 3B, the barrier film 204 is omitted. This will be the same in FIGS. 4A to 5C.

In order to prevent oxidation, a corrosive inhibitor such as benzotriazole (BTA) is coated on the surface of the Cu wiring 208 that has been subjected to the CMP polishing. Therefore, a preprocessing for removing the corrosive inhibitor and reducing $CuO_X$ on the surface is performed (see FIG. 3A.) The preprocessing may be carried out by a degas process or a $H_2$ heat treatment. Instead of the $H_2$ heat treatment, a $H_2$ plasma process may be performed, or a plasma process or heat treatment using $NH_3$ may be performed.

Next, a $MnO_2$ film 210 is formed on the entire wafer surface with a thickness of, e.g., about 2 nm to 5 nm, by CVD (Chemical Vapor Deposition), ALD (Atomic Layer Deposition), or PVD, and the $MnO_2$ film 210 thus formed serves as the metal cap 209 (see FIG. 3B). The manganese oxide film thus formed is not necessarily $MnO_2$. In this example, however, the manganese oxide film is expressed as $MnO_2$, which is a representative manganese oxide.

When the $MnO_2$ film is formed by PVD, the sputtering may be performed by using a $MnO_2$ target. Alternatively, the $MnO_2$ film may be formed by reactive sputtering in which $O_2$ is added during the film formation by using a Mn target.

When the $MnO_2$ film is formed by CVD, the film formation is executed by supplying and thermally decomposing a manganese compound gas on the wafer, or by supplying and reacting a manganese compound gas and an oxygen-containing gas on the wafer.

As for the manganese compound gas, it is preferable to use a cyclopentadienyl manganese compound such as bis(alkylcyclopentadienyl)manganese expressed by a general formula $Mn(RC_5H_4)_2$, a carbonyl manganese compound such as decacarbonyl2manganese ($Mn_2(CO)_{10}$ or methylcyclopentadienyltricarbonylmanganese (($CH_3C_5H_4)Mn(CO)_3$), a betadiketone managanese compound such as bis(dipivaloylmethanate)manganese ($Mn(C_{11}H_{19}O_2)_2$), an amidinate manganese compound such as bis(N,N'-dialkylaceteamidinate) manganese expressed by a general formula $Mn(R^1N-CR^3-NR^2)_2$ described in U.S. Patent Application Publication No. US2009/0263965A1, or an amideaminoalkane manganese compound such as bis(N,N'-1-alkylamide-2-dialkylaminoalkane)manganese represented by a general formula $Mn(R^1N-Z-NR^2_2)_2$ described in International Application Publication No. 2012/060428. Here, R, $R^1$, $R^2$ and $R^3$ are alkyl groups represented by general formula $-C_nH_{2n+1}$ (n being an integer greater than or equal to 0), and Z is an alkylene group represented by $-C_nH_{2n}-$ (n being an integer greater than or equal to 0). Among the above-described compounds, an amideaminoalkan manganese compound is preferably used because it allows low-temperature film formation.

In the case of forming the MnO$_2$ film by ALD, the film formation is carried out by alternately supplying a manganese compound gas and an oxygen-containing gas.

The MnO$_2$ film 210 thus formed is an insulating film. Therefore, even if it is formed on the entire wafer surface including the surface of the interlayer insulating film 202, the leak current between Cu wirings is not increased.

(Second Method)

Figure 4A:
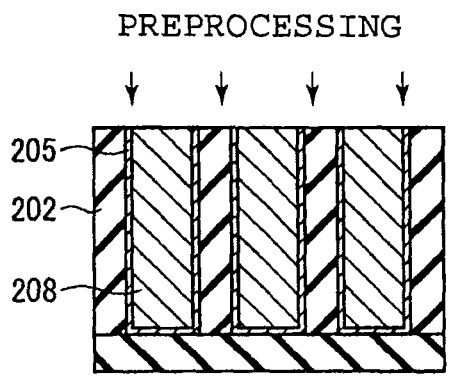
FIGS. 4A to 4C are process cross sectional views for explaining a second method of the metal cap forming process.

In a second method as well as the first method, first, a preprocessing for removing the corrosive inhibitor and reducing CuO$_X$ from the surface is performed by a degas process, and heat treatment or a plasma process using H$_2$ or NH$_3$, as shown in FIG. 4A.

Figure 4B:
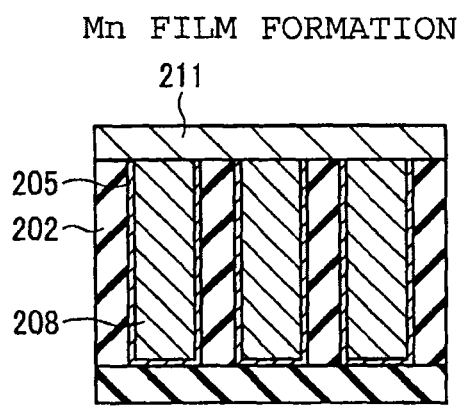

Next, a Mn film 211 is formed on the entire wafer surface by CVD, ALD, or PVD (see FIG. 4B).

When the Mn film is formed by PVD, the film formation is carried out by sputtering using, e.g., a Mn target.

When the Mn film is formed by CVD, the manganese compound gas and the reducing reactant gas are supplied onto the wafer and react with each other. The film formation is performed by supplying an oxygen-containing gas onto the wafer W to make it react thereon.

As for the manganese compound gas, the one used in the first method can be used. As for the reducing reactant gas, it is preferable to use a H$_2$ gas, a CO gas, a R—CHO gas such as HCHO or the like, a R—COOH gas such as HCOOH or the like. Here, R is an alkyl group represented by —C$_n$H$_{2n+1}$ (n being an integer greater than or equal to 0).

When the Mn film is formed by ALD, the film formation is carried out by alternately supplying the manganese compound gas and the reducing reactant gas.

Figure 4C:
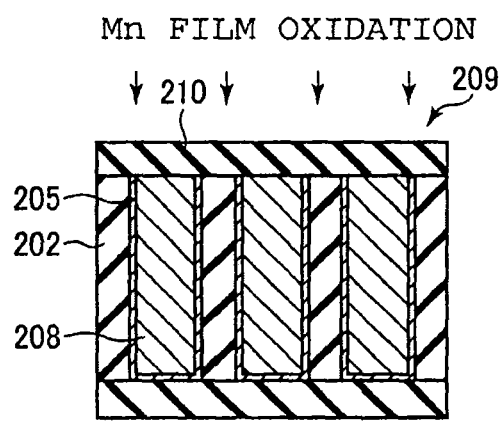

Thereafter, a MnO$_2$ film 210 is formed by oxidizing the entire surface of the Mn film 211, and the MnO$_2$ film 210 thus formed serves as a metal cap 209 (see FIG. 4C). As for the process for oxidation, an O$_2$ plasma process may be applied. Preferably, a microwave plasma process may be applied.

The MnO$_2$ film 210 thus formed is an insulating film. Therefore, even if it is formed on the entire surface of the wafer, the leak current between the Cu wirings is not increased.

(Third Method)

Figure 5A:
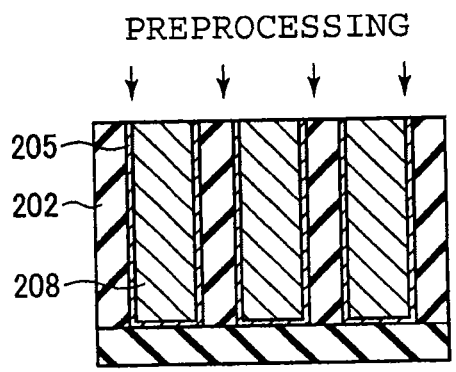
FIGS. 5A to 5C are process cross sectional views for explaining a third method of the metal cap forming process.

As shown in FIG. 5A, in the third method as well as the first method, first, a preprocessing for removing the corrosive inhibitor and reducing CuO$_X$ from the surface is performed by a degas process, and a plasma process or a heat treatment using H$_2$ or NH$_3$.

Figure 5B:
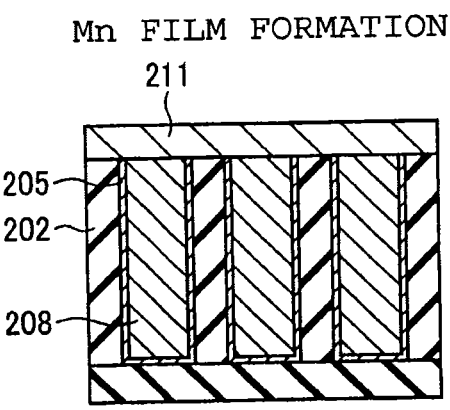
Figure 5C:
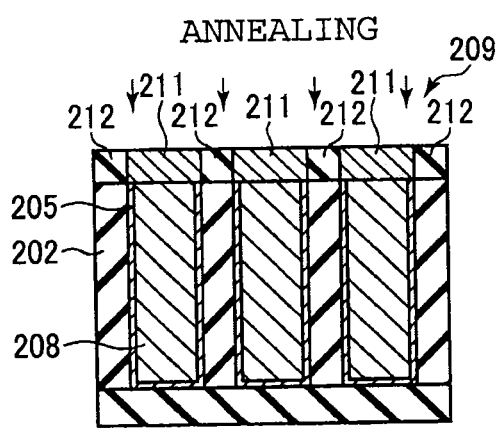

Next, as in the second embodiment, the Mn film 211 is formed on the entire wafer surface by CVD, ALD, or PVD (see FIG. 5B).

Thereafter, by performing annealing, the Mn film 211 remains on the Cu wiring 208 as it is, and the Mn film 211 on the interlayer insulating film 202 between the Cu wirings 208 reacts with Si and O of the interlayer insulating film 202, thereby forming a MnSiOx film 212 as a self-aligned film. As a result, the metal cap 209 including the Mn film 211 and the MnSiOx film 212 is formed (see FIG. 5C).

In this method, the MnSiOx film 212 as an insulating film is formed on the interlayer insulating film 202, so that the leak current between the Cu wirings is not increased.

In the third method, instead of forming a Mn film on the entire surface, a Mn alloy film such as Mn—Ru or the like may be formed. In the case of forming a Mn alloy film, the film formation can be performed by PVD using a Mn alloy target, CVD or ALD using a manganese compound gas, an alloy component gas and a reducing reactant gas.

In accordance with the present embodiment, a Cu wiring is formed by filling a Cu film in the trench or the hole by PVD. Therefore, the generation of a void is prevented unlike the case of filling the trench or the hole by Cu plating. After the Cu wiring 208 is formed, the metal cap 209 formed of a Mn containing film which has high adhesivity with the Cu wiring 208 is formed. Hence, the Cu wiring 208 having high electromigration tolerance can be obtained. At this time, the Mn containing film is formed on the entire surface, and the metal cap 209 is formed such that at least each portion on the interlayer insulating film 202 between the Cu wirings 208 has an insulating property. Therefore, the increase in the leak current between the Cu wirings can be suppressed without using a complicated process for selectively forming the metal cap at the Cu wiring.

When the metal cap is provided, the metal forming the metal cap is diffused and remains in the Cu wiring, which may increase the wiring resistance. However, when the Mn containing film is formed as the metal cap 209 and the Ru liner film 205 is formed below the Cu wiring 208 as in the present embodiment, the residual Mn is concentrated in the Ru liner film 205 and thus, the residual amount of Mn in the Cu wiring 208 is extremely reduced. Accordingly, in the present embodiment, the Cu wiring having a small amount of residual Mn and a low wiring resistance can be obtained.

By providing the metal cap, the inter-wiring capacitance may be changed. Since, however, the relative dielectric constant of MnO$_2$ forming the metal cap is about 5.1 and the relative dielectric constant of SiCN forming the dielectric cap is about 5, the inter-wiring capacitance is hardly affected by whether or not the metal cap is provided.

Among the above series of processes, step 2 of forming the barrier film 204, step 3 of forming the Ru liner film 205, step 4 of forming the Cu film 206, and step 5 of forming the additional layer 207 are preferably continued in the vacuum without being exposed to the atmosphere. However, the exposure to the atmosphere may occur between any two steps.

<Cu Wiring Forming System>

Hereinafter, a Cu wiring forming system suitable for implementation of the Cu wiring forming method in accordance with an embodiment of the present invention will be described.

<Film Forming System Suitable for Processes Up to Formation of an Additional Layer>

Figure 6:
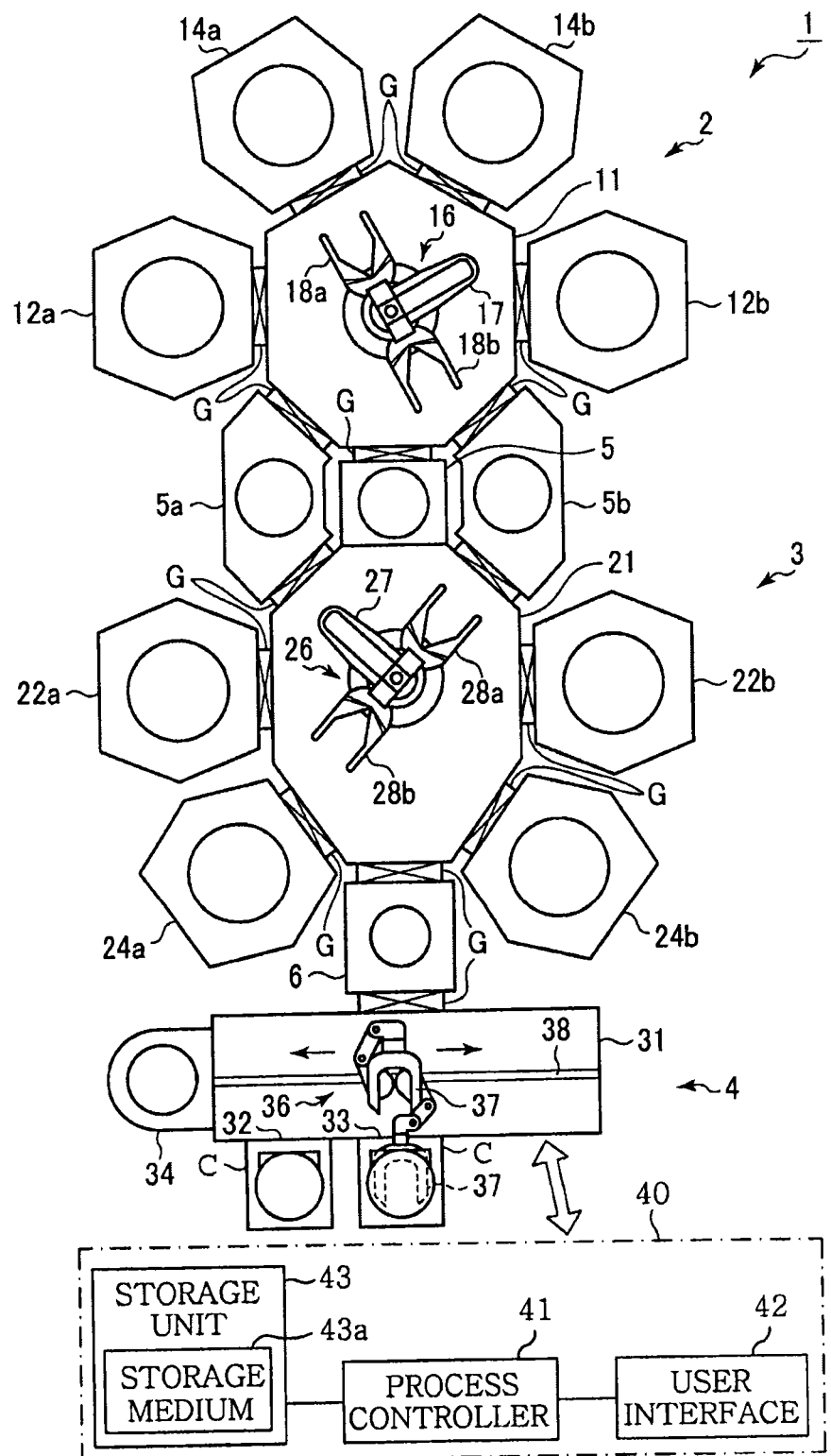
FIG. 6 is a top view showing an example of a film forming system suitable for film formation processes up to formation of an additional layer in the Cu wiring forming method in accordance with the embodiment of the present invention.

FIG. 6 is a top view showing an example of a film forming system of a multi chamber type suitable for processes up to formation of an additional layer in the Cu wiring forming method.

The film forming system 1 includes a first processing unit 2 for forming a barrier film and a Ru liner film, a second processing unit 3 for forming a Cu film and a loading/unloading unit 4. The film forming system 1 for forming Cu wiring on the wafer W performs processes up to the formation of an additional layer in the above embodiment. Further, the formation of the metal cap after the polishing by CMP and the formation of the dielectric cap are performed by another film forming system.

The first processing unit 2 has a first vacuum transfer chamber 11 having a heptagonal cross section, and two barrier film forming apparatuses 12a and 12b and two Ru liner film forming apparatuses 14a and 14b which are connected to walls corresponding to four sides of the first vacuum transfer chamber 11. The barrier film forming apparatuses 12a and the Ru liner film forming apparatus 14a are disposed in axial symmetry with the barrier film forming apparatus 12b and the Ru liner film forming apparatus 14b.

Degas chambers 5a and 5b for performing a degas process of the wafer W are connected to walls corresponding to the other two sides of the first vacuum transfer chamber 11.

Further, an exchange chamber 5 for transferring the wafer W between the first vacuum transfer chamber 11 and a second vacuum transfer chamber 21 to be later described is connected to the wall between the degas chambers 5a and 5b of the first vacuum transfer chamber 11.

The barrier film forming apparatuses 12a and 12b, the Ru liner film forming apparatuses 14a and 14b, the degas chambers 5a and 5b, and the exchange chamber 5 are connected to the respective sides of the first vacuum transfer chamber via gate valves G. They communicate with the first vacuum transfer chamber 11 by opening the corresponding gate valves G and are isolated from the first vacuum transfer chamber 11 by closing the corresponding gate valves G.

The inner space of the first vacuum transfer chamber is maintained at a predetermined vacuum atmosphere. Provided in the first vacuum transfer chamber 11 is a first transfer unit 16 for loading and unloading the wafer W into and from the barrier film forming apparatuses 12a and 12b, the Ru liner film forming apparatuses 14a and 14b, the degas chambers 5a and 5b, and the exchange chamber 5. The first transfer unit 16 is disposed substantially at the center of the first vacuum transfer chamber 11, and has a rotatable and extensible/contractible portion 17. The rotatable and extensible/contractible portion 17 has two support arms 18a and 18b for supporting the wafer W at leading ends thereof. The two support arms 18a and 18b are attached to the rotatable and extensible/contractible portion 17 so as to face the opposite directions.

The second processing unit 3 includes: a second vacuum transfer chamber 21 having an octagonal cross section; two first Cu film forming apparatuses 22a and 22a connected to walls corresponding to two facing sides of the second vacuum transfer chamber 21 for forming a Cu film to fill a recess including a trench; and two Cu film forming apparatuses 24a and 24b for forming an additional layer.

The degas chambers 5a and 5b are connected to walls corresponding to two sides of the second vacuum transfer chamber 21 which face the first processing unit 2, and the exchange chamber 5 is connected to the wall between the degas chambers 5a and 5b. In other words, the exchange chamber 5 and the degas chambers 5a and 5b are provided between the first vacuum transfer chamber 11 and the second vacuum transfer chamber 21, and the degas chambers 5a and 5b are disposed at both sides of the exchange chamber 5. Moreover, a load-lock chamber 6 that allows atmospheric transfer and vacuum transfer is connected to the side facing the loading/unloading unit 4.

The first Cu film forming apparatuses 22a and 22b, the second Cu film forming apparatuses 24a and 24b, the degas chambers 5a and 5b, and the load-lock chamber 6 are connected to the respective sides of the second vacuum transfer chamber 21 via gate valves G. They communicate with the second vacuum transfer chamber 21 by opening the corresponding gate valves G and are isolated from the second vacuum transfer chamber 21 by closing the corresponding gate valves G. The exchange chamber 5 is connected to the second transfer chamber 21 without passing through a gate valve.

The inner space of the second vacuum transfer chamber 21 is maintained at a predetermined vacuum atmosphere. Provided in the second vacuum transfer chamber 21 is a second transfer unit 26 for loading and unloading the wafer W into and from the first Cu film forming apparatuses 22a and 22b, the second Cu film forming apparatuses 24a and 24b, the degas chambers 5a and 5b, the load-lock chamber 6 and the exchange chamber 5. The second transfer unit 26 is disposed substantially at the center of the second vacuum transfer chamber 21, and has a rotatable and extensible/contractible portion 27. The rotatable and extensible/contractible portion 27 has two support arms 28a and 28b for supporting the wafer W at leading ends thereof. The two support arms 28a and 28b are attached to the rotatable and extensible/contractible portion 27 so as to face the opposite directions.

The loading/unloading port 4 is provided at the opposite side of the second processing unit 3 with the load-lock chamber 6 therebetween, and has an atmospheric transfer chamber 31 connected to the load-lock chamber 6. A gate valve G is provided at a wall between the load-lock chamber 6 and the atmospheric transfer chamber 31. Two connection ports 32 and 33 are disposed at a wall of the atmospheric transfer chamber 31 opposite to the wall connected to the load-lock chamber 6 of the atmospheric transfer chamber 31. The two connection ports 32 and 33 connects carriers C accommodating therein wafers W as target substrates. The connection ports 32 and 33 are provided with shutters (not shown) and when a carrier C that is either empty or accommodates therein wafers W is directly attached to the shutter, the shutter is opened and the inner space of the carrier C communicates with that of the atmospheric transfer chamber 31 while preventing intrusion of air from the outside. Further, an alignment chamber 34 is provided at a side of the atmospheric transfer chamber 31, and the alignment of the wafer W is performed therein. Provided in the atmospheric transfer chamber 31 is an atmospheric transfer unit 36 for loading and unloading the wafer W into and from the carrier C and the load-lock chamber 6. The atmospheric transfer unit 36 has two multi-joint arms and can move on a rail 38 along the arrangement direction of the carriers C. Therefore, the atmospheric transfer unit 36 transfers wafers W mounted on hands 37 provided at leading ends of the respective arms.

The film forming system 1 includes a control unit 40 for controlling the respective components of the film forming system 1. The control unit 40 includes a process controller 41 having a microprocessor (computer) for controlling the respective components of the film forming system 1, a user interface 42 and a storage unit 43. The user interface 42 includes a keyboard through which an operator performs a command input to manage the film forming system 1, a display for visually displaying the operational states of the film forming system 1, and the like. The storage unit 43 stores therein control programs to be used in realizing various processes performed by the film forming system 1 under the control of the process controller 41, programs, i.e., recipes, to be used in operating the respective components of the film forming system 1 to carry out processes under processing conditions and various data. The user interface 42 and the storage unit 43 are connected to the process controller 41.

The recipes are stored in a storage medium 43a in the storage unit 43. The storage medium 43a may be a hard disk or a portable medium such as a CD-ROM, a DVD, a flash memory or the like. Alternatively, the recipes may be suitably transmitted from other devices via, e.g., a dedicated transmission line.

If necessary, a predetermined recipe is read out from the storage unit 43 under the instruction from the user interface 42 and is executed by the process controller 41. Accordingly, a desired process is performed in the film forming system 1 under the control of the process controller 41.

In the film forming system 1, the wafer W having trenches or holes in a predetermined pattern is unloaded from the carrier C and loaded into the load-lock chamber 6 by the atmospheric transfer unit 36. After the pressure in the load-lock chamber 6 is decreased to a vacuum level equivalent to that in the second vacuum transfer chamber 21, the wafer W is unloaded from the load-lock chamber 6 to be loaded into the degas chamber 5*a* or 5*b* via the second vacuum transfer chamber 21 by the second transfer unit 26. Then, the wafer W is subjected to the degas process.

Thereafter, the wafer W is unloaded from the degas chamber 5*a* or 5*b* to be loaded into the barrier film forming apparatus 12*a* or 12*b* via the first vacuum transfer chamber 11 by the first transfer unit 16. Then, the above-described barrier film is formed. After the barrier film is formed, the wafer W is unloaded from the barrier film forming apparatus 12*a* or 12*b* to be loaded into the Ru liner film forming apparatus 14*a* or 14*b* by the first transfer unit 16. Then, the Ru liner film is formed. After the Ru liner film is formed, the wafer W is unloaded from the Ru liner film forming apparatus 14*a* or 14*b* and transferred into the exchange chamber 5 by the first transfer unit 16.

Thereafter, the wafer W is unloaded from the exchange chamber 5 to be loaded into the first Cu film forming apparatus 22*a* or 22*b* via the second vacuum transfer chamber 21 by the second transfer unit 26. Then, Cu is filled in the recess including the trench by forming a Cu film. Next, an additional layer is formed on the Cu film filled in the trench. Herein, the additional layer may be formed by continuously forming a Cu film in the first Cu film forming apparatus 22*a* or 22*b*, or may also be formed by unloading the wafer W from the first Cu film forming apparatus 22*a* or 22*b* and loading the wafer W into the second Cu film forming apparatus 24*a* or 24*b* by the second transfer device 26 and then forming a Cu film therein.

Upon completion of forming the additional layer, the wafer W is transferred into the load-lock chamber 6, and the pressure in the load-lock chamber is returned to the atmospheric pressure. Thereafter, the wafer W on which the Cu film is formed is unloaded by the atmospheric transfer unit 36 to be returned to the carrier C. Such processes are repeated for the number of wafers W in the carrier.

In accordance with the film forming system 1, the barrier film, the liner film, the Cu film and the additional layer are formed in the vacuum without being exposed to the atmosphere. Therefore, oxidation at the interfaces of the films can be avoided, and a high-performance Cu wiring can be obtained.

When the additional layer is formed by Cu plating, the wafer W is unloaded after the Cu film is formed.

<First Cu Film Forming Apparatus>

Hereinafter, a preferred embodiment of the first Cu film forming apparatus 22*a* (22*b*) for forming a Cu film will be described.

Figure 7:
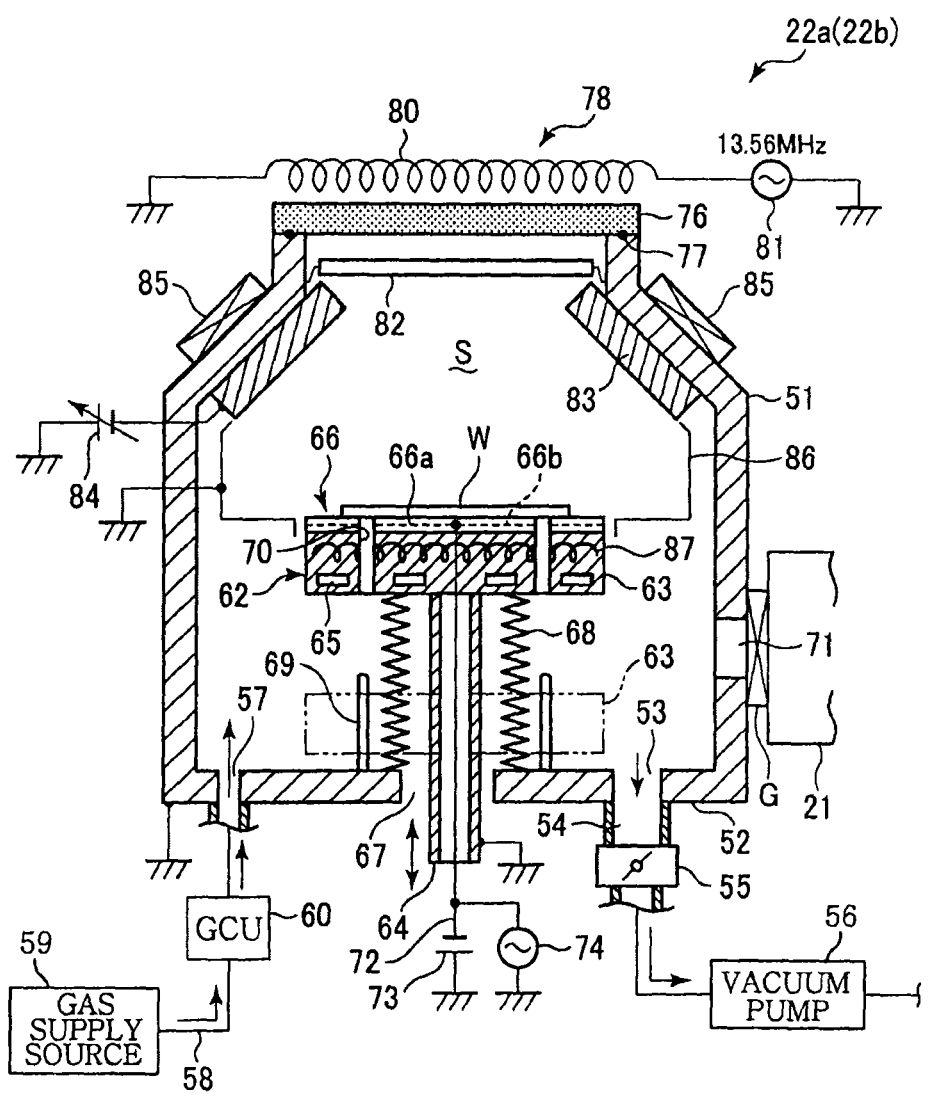
FIG. 7 is a cross sectional view showing a Cu film forming apparatus which is installed in the film forming system in FIG. 6.

FIG. 7 is a cross sectional view showing an example of the first Cu film forming apparatus. Here, an ICP (Inductively Coupled Plasma) type plasma sputtering apparatus that is an iPVD apparatus will be described as an example of the Cu film forming apparatus.

As shown in FIG. 7, the Cu film forming apparatus 22*a* (22*b*) includes a cylindrical processing chamber 51 made of, e.g., aluminum or the like. The processing chamber 51 is grounded, and a gas exhaust port 53 is provided at a bottom portion 52 thereof. A gas exhaust line 54 is connected to the gas exhaust port 53. The gas exhaust line 54 is connected to a throttle valve 55 and a vacuum pump 56 for controlling a pressure and thus, the inner space of the processing chamber 51 can be evacuated to vacuum. Further, a gas inlet port 57 for introducing a predetermined gas into the processing chamber 51 is provided at the bottom portion 52 of the processing chamber 51. The gas inlet port 57 is connected to a gas supply line 58, which is connected to a gas supply source 59 for supplying a rare gas serving as a plasma excitation gas, e.g., Ar gas, or another required gas, e.g., $N_2$ gas. The gas supply line 58 is provided with a gas control unit (GCU) 60 having a gas flow rate controller, a valve or the like.

Provided in the processing chamber 51 is a mounting mechanism 62 for mounting thereon a wafer W as a target substrate. The mounting mechanism 62 has a circular plate-shaped mounting table 63, and a hollow cylindrical column 64 for supporting the mounting table 63 while being grounded. The mounting table 63 is made of a conductive material, e.g., aluminum alloy or the like and is grounded via the column 64. The mounting table 63 has therein a cooling jacket 65 through which a coolant is supplied via a coolant path (not shown). Further, in the mounting table 63, a resistance heater 87 that is coated with an insulating material is provided on the cooling jacket 65. The resistance heater 87 is supplied with a power from a power supply (not shown). The mounting table 63 includes a thermocouple (not shown), so that the wafer can be controlled to have a predetermined temperature by controlling coolant supply to the cooling jacket 65 and power supply to the resistance heater 87 based on the temperature detected by the thermocouple.

Provided on a top surface of the mounting table 63 is a thin circular plate-shaped electrostatic chuck 66 in which an electrode 66*b* is embedded in a dielectric member 66*a* made of, e.g., alumina or the like. Accordingly, the wafer W can be adsorptively held thereon by electrostatic force. The lower portion of the column 64 extends downward through an insertion through hole 67 formed at the center of the bottom portion 52 of the processing chamber 51. The column 64 is vertically movable by an elevation unit (not shown), so that the entire mounting mechanism 62 is vertically moved.

An extensible/contractible metal bellows 68 is provided so as to surround the column 64. The metal bellows has an upper end hermitically attached to the bottom surface of the mounting table 63 and a lower end hermitically attached to the top surface of the bottom portion 52 of the processing chamber 51. Accordingly, the mounting mechanism 62 can be vertically moved while maintaining the airtightness in the processing chamber 51.

A plurality of, e.g., three (only two are shown in FIG. 7) support pins 69 are uprightly mounted on the bottom portion 52 toward the up side, and pin insertion through holes 70 are formed in the mounting table 63 so as to correspond to the support pins 69. Therefore, when the mounting table 63 is lowered, the upper end portions of the support pins 69 that have penetrated through the pin insertion through holes 70 receive the wafer W and transfer the wafer W to a transfer arm (not shown) that comes from the outside. Therefore, a loading/unloading port 71 through which the transfer arm comes in and out is provided at a lower sidewall of the processing chamber 51, and an openable/closeable gate valve G is provided at the loading/unloading port 71. The second vacuum transfer chamber 21 is provided at the opposite side of the gate valve G.

A power supply for an electrostatic chuck 73 is connected to the electrode 66*b* of the electrostatic chuck 66 via a power supply line 72. By applying a DC voltage from the power supply for the electrostatic chuck 73 to the electrode 66*b*, the wafer W is adsorptively held by electrostatic force. In addition, a high frequency bias power supply 74 is connected to the power supply line 72, so that a high frequency bias power is applied to the electrode 66*b* of the electrostatic chuck 66 via the power supply line 72 to apply the bias power to the wafer W. The frequency of the high frequency power is preferably in a range from about 400 kHz to 60 MHz, and the high frequency power of, e.g., about 13.56 MHz is applied.

Meanwhile, a high frequency transmission plate 76 made of a dielectric material, e.g., alumina or the like, is hermitically provided at the ceiling portion of the processing chamber 51 via a seal member 77 such as an O-ring or the like. Further, a plasma generation source 78 for generating a plasma from a rare gas as a plasma excitation gas, e.g., Ar gas, in a processing space S of the processing chamber 51 is provided on the transmission plate 76. The plasma excitation gas may be another rare gas, e.g., He, Ne, Kr or the like, other than Ar.

The plasma generation source 78 has an induction coil 80 disposed so as to correspond to the transmission plate 76. A high frequency power supply 81 having a high frequency of, e.g., 13.56 MHz, for plasma generation is connected to the induction coil 80 to introduce a high frequency power into the processing space S via the transmission plate 76 to form an induced electric field.

Moreover, a baffle plate 82 made of, e.g., aluminum, is provided directly under the transmission plate 76 in order to diffuse the introduced high frequency power. Further, a target 83 made of Cu is provided under the baffle plate 82 so as to surround the upper portion of the processing space S. The target has an inwardly inclined cross section and an annular shape (truncated conical shape), for example. A variable DC power supply 84 of a variable voltage is connected to the target 83 in order to apply a DC power for attracting Ar ions. Alternatively, an AC power supply may be used instead of a DC power supply.

Further, a magnet 85 is provided at the outer circumferential side of the target 83 to apply a magnetic field to the target 83. The target 83 is sputtered into Cu atoms or Cu atomic groups by Ar ions in the plasma and mostly ionized while passing through the plasma.

Moreover, a cylindrical protection cover member 86 made of e.g. aluminum or copper, is provided under the target 83 to surround the processing space S. The protection cover member 86 is grounded and a lower portion thereof is bent inward so as to be positioned near the side portion of the mounting table 63. Thus, an inner end of the protection cover member 86 is disposed so as to surround the outer peripheral side of the mounting table 63.

Further, the respective sections of the first Cu film forming apparatus 22a (22b) are controlled by the above-described control unit 40.

In the first Cu film forming apparatus 22a (22b) configured as described above, the wafer W is loaded into the processing chamber 51 shown in FIG. 7 and mounted on the mounting table 63. Then, the wafer W is adsorbed on the electrostatic chuck 66, and the following processes are carried out under the control of the control unit 40. At this time, the temperature of the mounting table 63 is controlled by controlling the supply of a coolant to the cooling jacket or the supply of a power to the resistance heater 87 based on the temperature detected by the thermocouple (not shown).

First, the gas control unit 60 is controlled to allow Ar gas to flow at a predetermined flow rate in the processing chamber 51 that has been set to a predetermined vacuum state by operating the vacuum pump 56, and at the same time, the processing vessel 51 is maintained at a predetermined vacuum level by controlling the throttle valve 55. Next, a DC voltage is applied to the target 83 from the variable DC power source 84, and a high frequency power (plasma power) is applied to the induction coil 80 from the high frequency power supply 81 of the plasma generation source 78. Meanwhile, a predetermined high frequency bias power is applied to the electrode 66b of the electrostatic chuck 66 from the high frequency bias power source 74.

Accordingly, in the processing chamber 51, an Ar plasma is generated by the high frequency power applied to the induction coil 80 and thus, Ar ions are generated. These ions are attracted toward the target 83 by a DC voltage applied to the target 83 and collide with the target 83. Hence, the target 83 is sputtered and elements are emitted. At this time, the amount of elements emitted is optimally controlled by the DC voltage applied to the target 83.

The elements from the sputtered target 83 are mostly ionized while passing through the plasma. Here, the elements emitted from the target 83 are scattered downward in a state where ionized elements and electrically neutral atoms are mixed. Particularly, the elements can be ionized with high efficiency by increasing a plasma density by increasing the pressure in the processing chamber 51 to a certain level. Here, the ionization rate at this time is controlled by the high frequency power supplied from the high frequency power supply 81.

When the ions are introduced into an ion sheath region formed on the wafer W with a thickness of about a few mm by the high frequency bias power applied to the electrode 66b of the electrostatic chuck 66 from the high frequency bias power supply 74, the ions are accelerated and attracted with strong directivity toward the wafer W to be deposited on the wafer W. As a result, the Cu film is formed.

At this time, the wafer temperature is set to a high level in a range from about 65° C. to 350° C., and the bias power applied from the high frequency bias power supply 74 to the electrode 66b of the electrostatic chuck 66 is controlled. With this, the film formation of Cu and the etching by Ar are controlled to improve the mobility of Cu. As a result, Cu can be filled with good fillability even in a trench or a hole having a narrow opening. Specifically, on the assumption that the Cu film forming amount (film forming rate) is $T_D$ and the etching amount (etching rate) by ions of the plasma generation gas is $T_E$, it is preferable to control the bias power such that $0 \leq T_E/T_D < 1$ and more preferably $0 < T_E/T_D < 1$ is satisfied.

In view of ensuring good fillability, the pressure in the processing chamber 51 (processing pressure) is preferably in a range from about 1 mTorr to 100 mTorr (from about 0.133 Pa to 13.3 Pa) and more preferably in a range from about 35 mTorr to 90 mTorr (in a range from about 4.66 Pa to 12.0 Pa). Further, the DC power applied to the target is preferably in a range from about 4 kW to 12 kW and more preferably in a range from about 6 kW to 10 kW.

Further, when the opening of the trench or the hole is wide, the film formation can be carried out by setting the wafer temperature to a low level (−50° C. to 0° C.) and further decreasing the pressure in the processing chamber 51. Accordingly, the film forming rate can be increased. In this case, the film forming method is not limited to iPVD, and conventional PVD such as conventional sputtering, ion plating or the like can be employed.

Moreover, when the formation of the additional layer is continued in the first Cu film forming apparatus 22a (22b), it is not necessary to fill the additional layer in the fine recess. Therefore, it is preferable to perform the film formation at a film forming speed higher than that in the case of forming the Cu film for filling.

<Second Cu Film Forming Apparatus>

The second Cu film forming apparatus 24a (24b) may be basically the same as the first Cu film forming apparatus 22a (22b) shown in FIG. 7. Further, the film formation method is not limited to iPVD, and may be conventional PVD such as conventional sputtering, ion plating or the like. Since it is not necessary to fill the additional layer in a fine recess, it is preferable to perform the film formation at a film forming speed higher than that in the first Cu film forming apparatus 22a (22b).

<Barrier Film Forming Apparatus>

The barrier film forming apparatus 12a (12b) uses a film forming apparatus having the same configuration as that of the film forming apparatus shown in FIG. 7, except using a different material of the target 83, to form a film by plasma sputtering. The film formation method is not limited to the plasma sputtering and may be other PVD such as conventional sputtering, ion plating or the like, CVD (Chemical Vapor Deposition) or ALD (Atomic Layer Deposition), or CVD or ALD using a plasma. In view of reduction of impurities, PVD is preferred.

<Ru Liner Film Forming Apparatus>

Figure 8:
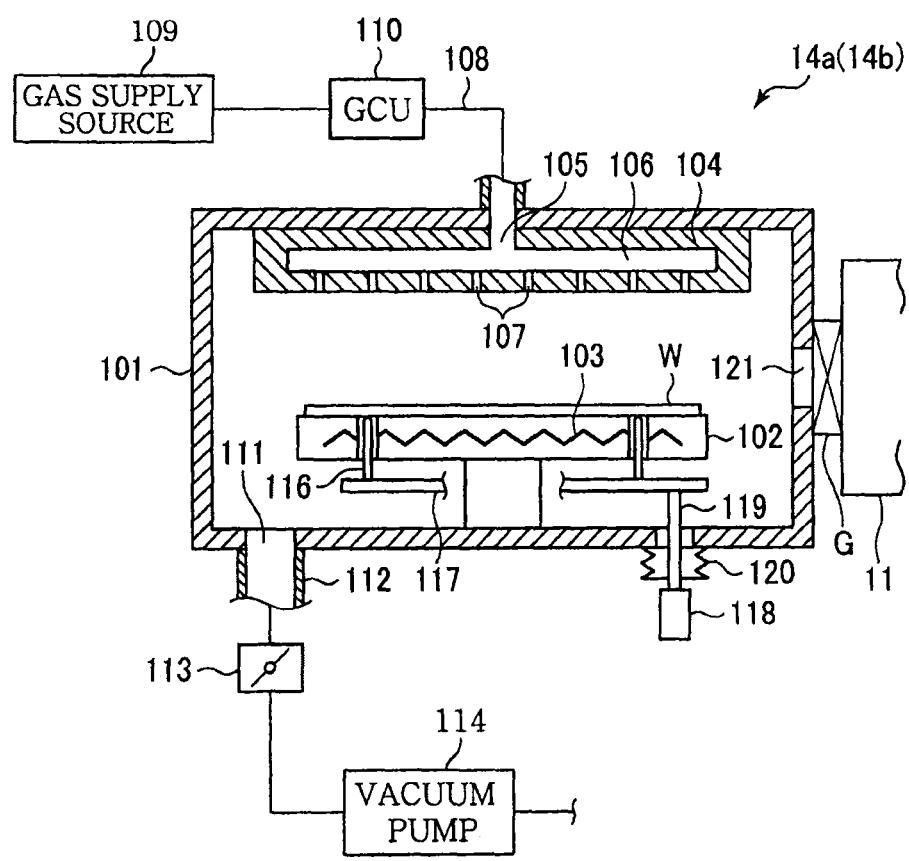
FIG. 8 is a cross sectional view showing a Ru liner film forming apparatus which is installed in the film forming system in FIG. 6.

Hereinafter, the Ru liner film forming apparatus 14a (14b) for forming a Ru liner film will be described. The Ru liner film is preferably formed by thermal CVD. FIG. 8 is a cross sectional view showing an example of the Ru liner film forming apparatus for forming an Ru film by thermal CVD.

As shown in FIG. 8, the Ru liner film forming apparatus 14a (14b) has a cylindrical processing chamber 101 made of, e.g., aluminum or the like. The processing chamber 101 has therein a mounting table 102 made of ceramic, e.g., AlN, for mounting thereon the wafer W and the mounting table 102 has therein a heater 103. The heater 103 emits a heat by a power supplied from a heater supply (not shown).

A shower head 104 is provided on the ceiling wall of the processing chamber 101 so as to face the mounting table 102 in order to introduce a purge gas or a processing gas for forming an Ru film into the processing chamber 101 in the form of a shower. The shower head 104 has a gas inlet port 105 at an upper portion thereof and a gas diffusion space 106 therein. A plurality of gas injection holes 107 is formed in the bottom surface of the shower head 104. A gas supply line 108 is connected to the gas inlet port 105, and a gas supply source 109 is connected to the gas supply line 108 to supply a purge gas or a processing gas for forming the Ru film. Further, a gas control unit (GCU) 110 including a gas flow rate controller, a valve or the like is disposed on the gas supply line 108. As described above, ruthenium carbonyl $[Ru_3(CO)_{12}]$ may be preferably used as a Ru forming gas. The Ru film can be formed by thermally decomposing ruthenium carbonyl.

A gas exhaust port 111 is provided in the bottom of the processing chamber 101, and an exhaust line 112 is connected to the gas exhaust port 111. A throttle valve 113 and a vacuum pump 114 which control the pressure are connected to the gas exhaust line 112, so that the processing chamber 101 can be exhausted to vacuum.

Three wafer support pins 116 (only two pins are shown) for transferring a wafer are provided in the mounting table 102 such that they can protrude from and retreat into the surface of the mounting table 102. The wafer support pins 116 are fixed to the support plate 117. The wafer support pins 116 are vertically moved through the support plate 117 by vertically moving a rod 119 by a driving unit (DU) 118 such as an air cylinder or the like. Reference numeral 120 denotes a bellows. Meanwhile, a wafer loading/unloading port 121 is formed at a sidewall of the processing chamber 101, so that a wafer W can be loaded from and unloaded into the first vacuum transfer chamber 11 in a state where a gate valve G is open.

In the Ru liner film forming apparatus 14a (14b), the gate valve G is open and the wafer W is mounted on the mounting table 102. Then, the gate valve G is closed and the processing chamber 101 is evacuated by the vacuum pump 114 so that the pressure in the processing chamber 101 can be controlled to a predetermined level. In a state where the wafer W is heated to a predetermined temperature through the mounting table 102 by the heater 103, a processing gas such as ruthenium carbonyl $[Ru_3(CO)_{12}]$ or the like is introduced into the processing chamber 101 from the gas supply source 109 through the gas supply line 108 and the shower head 104. Accordingly, the reaction of the processing gas is preformed on the surface of the wafer W, and the Ru film is formed on the wafer W.

The Ru film may be formed by using another film forming material other than ruthenium carbonyl, e.g., the aforementioned pentadienyl ruthenium compounds, together with decomposition gas such as $O_2$ gas. In addition, the Ru film may be formed by PVD. However, CVD using ruthenium carbonyl may be preferred because an improved step coverage is obtained and impurities in the film are reduced.

<Film Forming System for Metal Cap and Dielectric Cap>

The processes up to the formation of the additional layer in the above embodiment can be performed by the above-described film forming system 1. However, the processes for forming a metal cap and a dielectric cap upon completion of the annealing process and the CMP process are performed by using a separate film forming system. The film forming system used in forming the metal cap and the dielectric cap may be a multi-chamber type film forming system corresponding to the film forming system shown in FIG. 6. However, a single vacuum chamber may be provided when the number of required processing devices is small.

In the case of using the first method, as for an apparatus for forming a metal cap, a preprocessing apparatus for performing preprocessing and a film forming apparatus for forming a $MnO_2$ film or a Mn film are required. In the case of using the second method, an apparatus for oxidizing an Mn film, e.g., a microwave plasma processing apparatus using $O_2$ gas is required. In the case of using the third method, an annealing apparatus is required.

As for the preprocessing apparatus, it is possible to use a heat treatment apparatus or a plasma processing apparatus which is widely used in the field of the present invention. Moreover, as for the microwave plasma processing apparatus for oxidizing a Mn film used in the second method or the annealing apparatus used in the third method, an apparatus that is widely used in the field of the present invention may be used.

The $MnO_2$ film or the Mn film may be formed by PVD, CVD or ALD as described above. When the film is formed by PVD, it is possible to use the ICP plasma sputtering apparatus for iPVD shown in FIG. 7, a conventional sputtering apparatus, and further another PVD apparatus for ion plating or the like. When the film is formed by CVD or ALD, the apparatus shown in FIG. 8 may be used.

Further, as for the CVD apparatus for forming a dielectric cap such as a SiCN film, the apparatus shown in FIG. 8 may be used.

Furthermore, the annealing apparatus for annealing the wafer W unloaded from the film forming system 1 and the CMP apparatus for performing CMP polishing on the corresponding wafer W may have configurations widely used.

The Cu wiring forming system is formed by the film forming system for performing processes up to the formation of the additional layer, the film forming system for forming a metal cap and a dielectric cap, the annealing apparatus and the CMP apparatus. The respective components are integrally controlled by a common control unit having the same function as that of the control unit 40, so that the method of the above embodiment can be integrally controlled by a single recipe.

<Test Example>

Hereinafter, a test example will be described.

(Evaluation of Fillability or the Like)

After a TaN base film of about 4 nm was formed by iPVD and a Ru liner film of about 2 nm was formed by CVD in a trench having a width of about 20 nm, the trench was filled by forming a Cu film of about 20 nm on the wafer surface by iPVD under the following conditions. As a result, the trench having a width of about 20 nm was sufficiently filled.

(Electrical Characteristics)

i) Wiring Resistance

Figure 9:
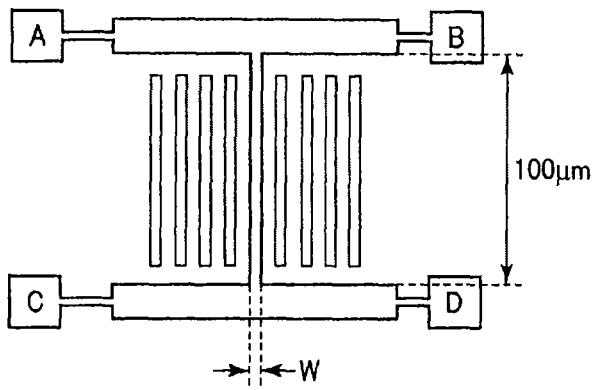
FIG. 9 shows a pattern used for measuring a wiring resistance.

Next, Cu wirings were formed on wafers having the trench patterns shown in FIG. 9 of which pattern widths were about 60 nm and 80 nm, respectively, and the wiring resistances were measured. Here, a TaN base layer of about 4 nm was formed by iPVD and a Ru liner film of about 2 nm was formed by CVD on each of the wafers. Thereafter, the trench was filled by forming a Cu film by iPVD. Next, a Cu additional layer was formed and then, annealing and CMP were performed to form a Cu wiring pattern. Then, a metal cap formed of a $MnO_2$ film was formed thereon with a thickness of about 2 nm and a SiCN dielectric cap was formed with a thickness of about 20 nm thereby obtaining samples (with $MnO_2$ cap). Further, other samples (without $MnO_2$ cap) in which SiCN dielectric caps were formed without forming the metal caps upon completion of the processes up to the CMP were obtained.

Figure 10:
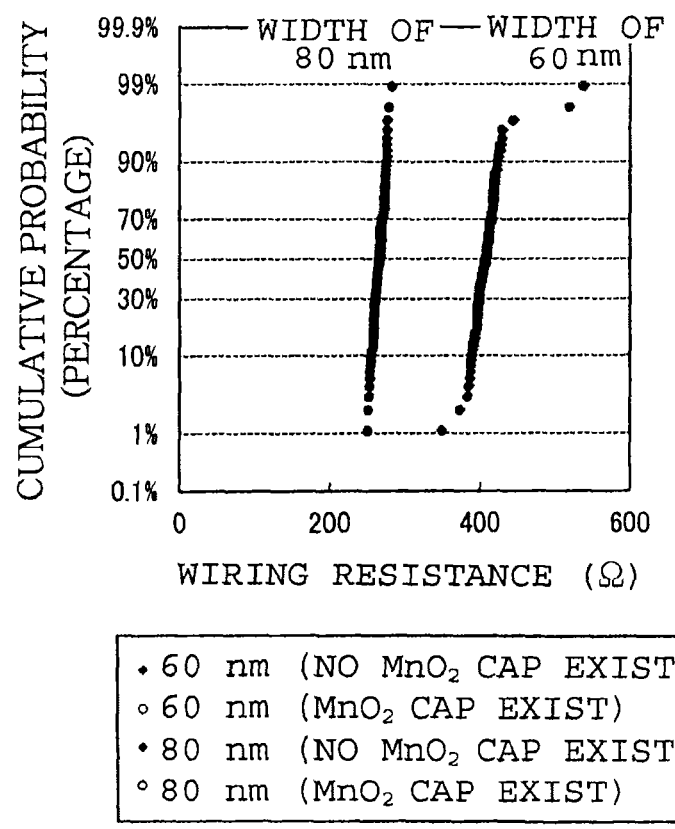
FIG. 10 shows a measurement result of a wiring resistance in the case of forming a $MnO_2$ cap after forming a Cu wiring on each of wafers having the trench pattern shown in FIG. 9 and pattern widths W of about 60 nm and 80 nm and in the case of not forming $MnO_2$ caps.

FIG. 10 shows measurement results of the wiring resistances of these samples. As shown in FIG. 10, in any of the pattern widths of about 60 nm and 80 nm, substantially the same wiring resistances were obtained in both of the case in which $MnO_2$ cap exists and the case in which $MnO_2$ cap does not exist. This shows that the wiring resistance is hardly affected by the formation of the metal cap formed of a $MnO_2$ film. This is, even if the metal cap formed of the $MnO_2$ film is formed, the amount of residual Mn in the Cu wiring is small and thus, the wiring resistance in the Cu wiring is not affected.

ii) Line-to-Line Capacitance

Figure 11:
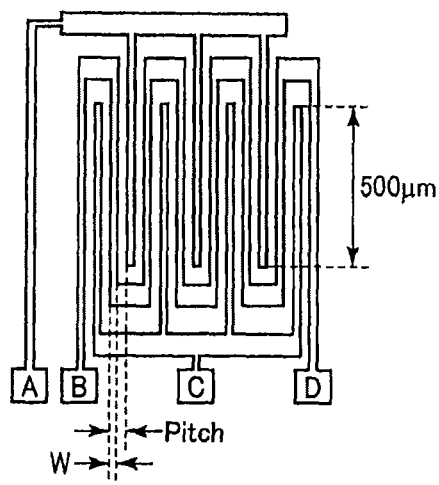
FIG. 11 shows a pattern used for measuring a line-to-line capacitance.

Next, a line-to-line capacitance was measured by forming Cu wiring on a wafer having the trench pattern shown in FIG. 11 of which pattern width W was about 60 nm. Here, the sample with $MnO_2$ cap and the sample without $MnO_2$ cap were obtained by using the wafers of the above-described configuration.

Figure 12:
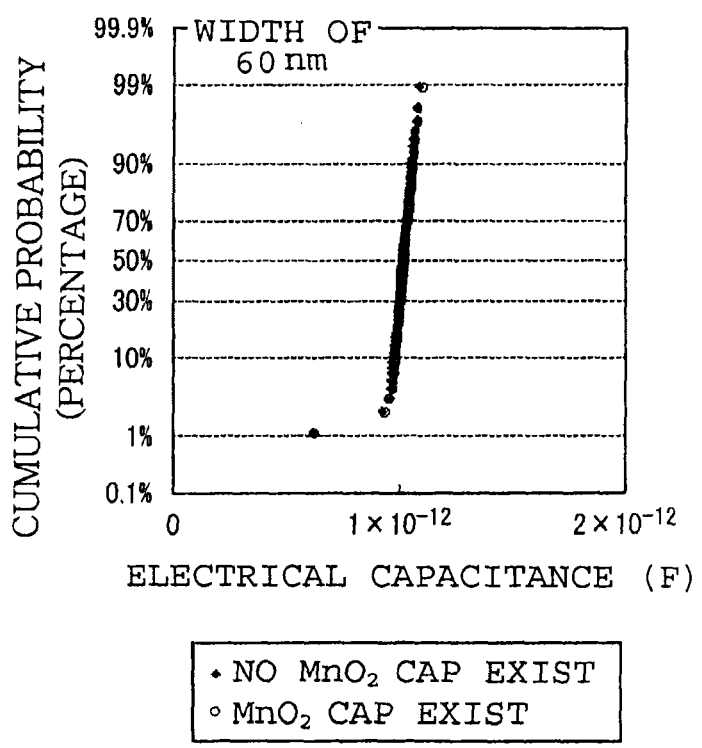
FIG. 12 shows a measurement result of a line-to-line capacitance in the case of forming a $MnO_2$ cap after forming a Cu wiring on a wafer having the trench pattern of FIG. 11 and a pattern width W of about 60 nm and in the case of not forming a $MnO_2$ cap.

FIG. 12 shows measurement results of the line-to-line capacitance of the samples. As shown in FIG. 12, the line-to-line capacitances were substantially same in both, the case where the $MnO_2$ cap exists and the case where the $MnO_2$ cap does not exist and it was clear that the $MnO_2$ film did not affect the line-to-line capacitance. This is because the dielectric constant of $MnO_2$ is about 5.1 and that of SiCN of the dielectric cap is about 5 which are substantially same.

iii) Line-to-Line Leak Current

Figure 13:
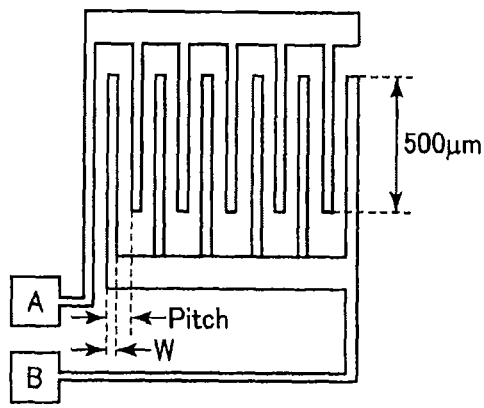
FIG. 13 shows a pattern used for measuring a line-to-line leakage current.

Next, the line-to-line leak current was measured by forming a Cu wiring on a wafer having the trench pattern shown in FIG. 13 of which pattern width W was about 60 nm. Here, the sample with $MnO_2$ cap and the sample without $MnO_2$ cap were obtained by using the wafers of the above-described configuration.

Figure 14:
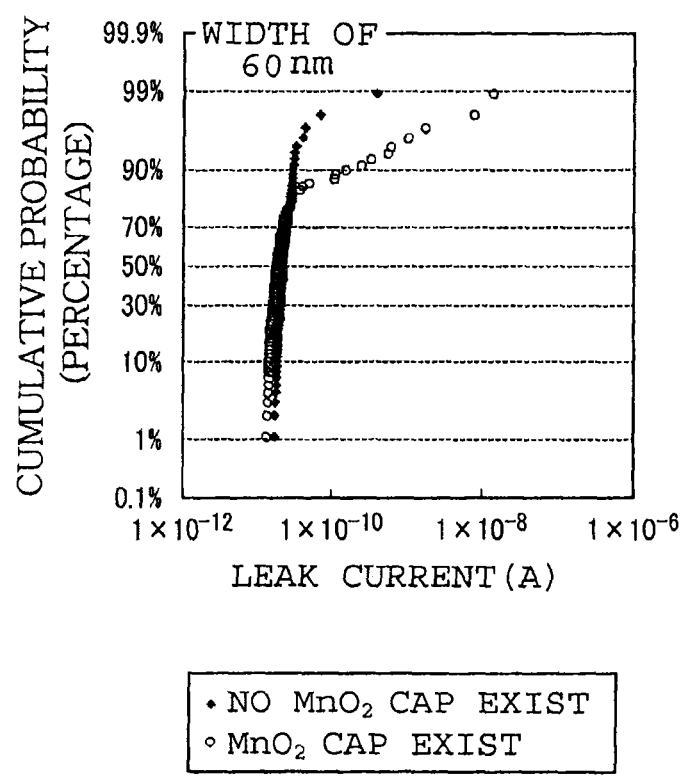
FIG. 14 shows a measurement result of a line-to-line leakage current in the case of forming a $MnO_2$ cap after forming a Cu wiring on a wafer having the trench pattern of FIG. 13 and a pattern width W of about 60 nm and in the case of not forming a $MnO_2$ cap.

FIG. 14 shows measurement results of the line-to-line leak current of the samples. As shown in FIG. 14, the line-to-line leak currents were substantially the same in both, the case where the $MnO_2$ cap exists and the case where the $MnO_2$ cap does not exist, and it was clear that the $MnO_2$ film did not affect the line-to-line leak current. This is because $MnO_2$ is an insulator and thus, does not affect the leak current even if it is formed on the insulating film (interlayer insulating film).

iv) Reliability Test

Figure 15:
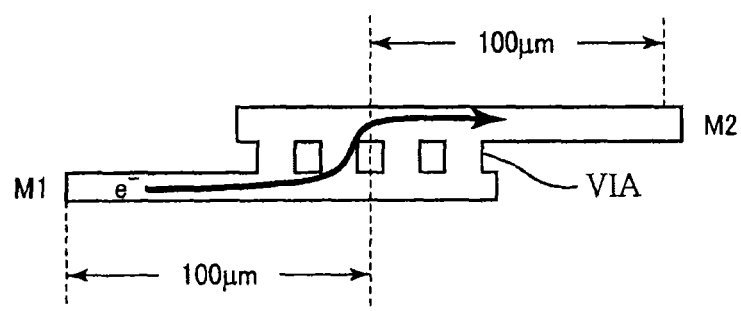
FIG. 15 shows a pattern used for evaluating reliability.

Next, the reliability was evaluated by forming a Cu wiring on a wafer having a test pattern (pattern width of about 100 nm and a via diameter of about 80 nm) shown in FIG. 15. In FIG. 15, "M1" and "M2" denote a lower wiring and an upper wiring, respectively. Here, the sample with $MnO_2$ cap and the sample without $MnO_2$ cap were obtained by using the wafers of the above-described configuration.

Figure 16A:
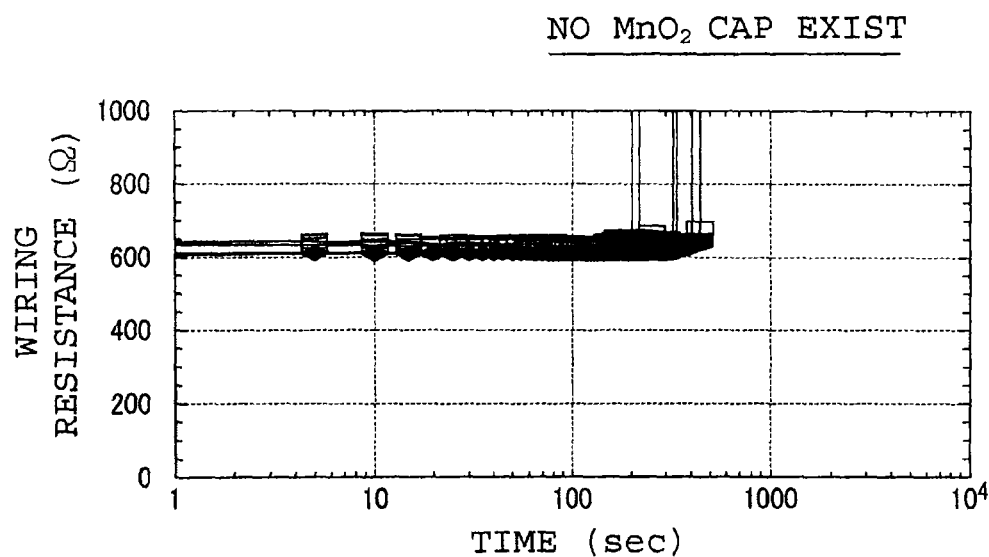
FIGS. 16A and 16B show evaluation results obtained in the case of forming a $MnO_2$ cap after forming a Cu wiring on a wafer having the trench pattern of FIG. 13 and in the case of not forming a $MnO_2$ cap.
Figure 16B:
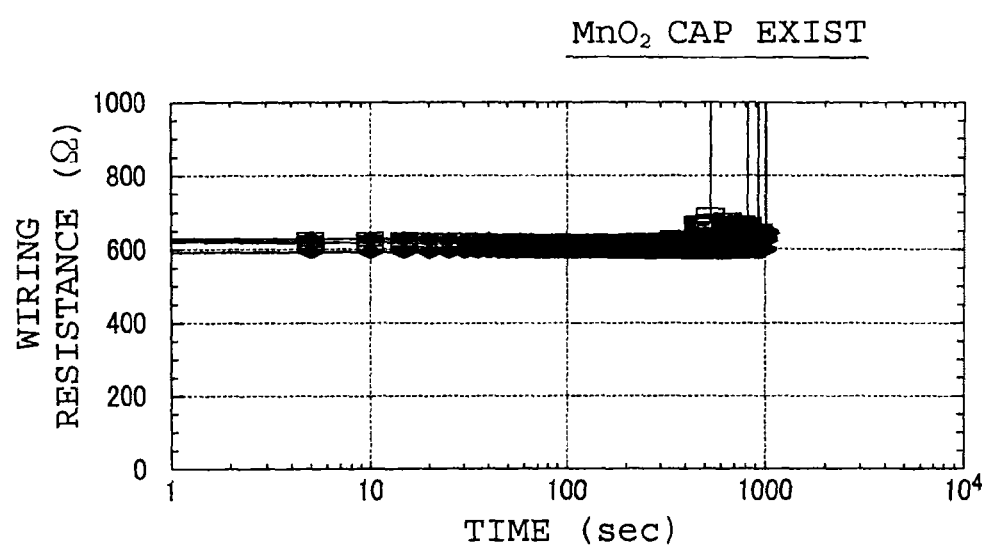

The reliability test was performed under the conditions in which a temperature was about 250° C. and a current density was about 25 M/cm². The result thereof is shown in FIGS. 16A and 16B. As shown in FIGS. 16A and 16B, the sample with $MnO_2$ cap has a longer life and higher reliability compared to the sample without $MnO_2$ cap. From this result, it is clearly seen that the electromigration resistance is improved by forming the $MnO_2$ cap.

In accordance with the present invention, the Cu wiring is formed by filling the Cu film in the trench or the hole by PVD, so that the formation of a void can be avoided unlike the case of filling the Cu film by Cu plating. Moreover, since the metal cap formed of an Mn containing film such as a manganese oxide film or the like which has high adhesivity with the Cu wiring is formed after the formation of the Cu wiring, the Cu wiring having high electromigration tolerance can be obtained. At this time, the Mn containing film is formed on the entire surface and the metal cap is formed such that at least the portions on the insulating film between the Cu wirings have insulation property. Therefore, the increase in the leak current between the Cu wirings can be suppressed without using a complicated process for selectively forming the metal cap on the Cu wiring.

<Other Application>

While the embodiments of the present invention have been described, the present invention may be variously modified without being limited to the above embodiments. For example, the film forming system is not limited to the type shown in FIG. 6 and may use a type in which all the film forming apparatuses are connected to a single transfer unit. Further, instead of the multi-chamber type system shown in FIG. 6, a system having separate apparatuses may be used to form a barrier film, a Ru liner film, a Cu film, an additional layer in separate apparatuses with being exposed to the atmosphere therebetween. Or, a system may be employed in which a part of those films is formed in the same film forming system and the other films are formed in a separate apparatus with being exposed to the atmosphere therebetween. In the same manner, when the metal cap and the dielectric cap are formed, a part of the devices may be formed in the same apparatus and others may be formed in a separate apparatus with being exposed to the atmosphere therebetween. Or, the entire devices may be formed in separate apparatuses with being exposed to the atmosphere therebetween.

The above embodiment has described the example in which the method of the present invention is applied to a wafer having a trench and a via (hole). However, the present invention may be applied to the case in which the wafer has only a trench. Moreover, the present invention may be applied to filling in devices having various structures such as a single damascene structure, a double damascene structure, a 3D mounting structure or the like. Further, although a semiconductor wafer has been described as an example of a substrate to be processed in the above embodiment, the semiconductor wafer includes a compound semiconductor such as GaAs, SiC, GaN or the like as well as a silicon substrate, and the present invention may be applied to a glass substrate for FPD (Flat Panel Display) such as a liquid display device or the like, a ceramic substrate or the like without being limited to a semiconductor wafer.

While the invention has been shown and described with respect to the embodiments, it will be understood by those skilled in the art that various changes and modification may be made without departing from the scope of the invention as defined in the following claims.

What is claimed is:

1. A method for forming a Cu wiring in a recess formed in an insulating film on a substrate, the method comprising:
   forming a barrier film on a surface of the recess and a surface of the insulating film outside the recess;
   forming a Cu film by PVD on the barrier film to fill the recess with the Cu film;
   forming an additional layer on the Cu film;
   removing by CMP the barrier film, the Cu film and the additional film formed outside the recess while leaving the barrier film and the Cu film formed in the recess to thereby form the Cu wiring in the recess;
   forming a metal cap formed of a manganese oxide film on an entire surface including the insulating film and the Cu wiring of the substrate; and
   forming a dielectric cap on the metal cap.

2. The Cu wiring forming method of claim 1, wherein said forming the metal cap includes forming the manganese oxide film by PVD, CVD or ALD.

3. The Cu wiring forming method of claim 1, further comprising forming an Ru film between said forming the barrier layer and said forming the Cu film.

4. The Cu wiring forming method of claim 3, wherein the Ru film is formed by CVD.

5. The Cu wiring forming method of claim 1, wherein the Cu film is formed by an apparatus configured to generate a plasma from a plasma generation gas in a processing chamber where a substrate is accommodated, scatter elements emitted from a target formed of Cu, ionize the elements in the plasma and attract ions onto the substrate by applying a bias power to the substrate.

6. The Cu wiring forming method of claim 1, wherein the additional layer is formed by forming a Cu film by PVD.

7. The Cu wiring forming method of claim 1, wherein the barrier film is selected from a group consisting of a Ti film, a TiN film, a Ta film, a TaN film, a Ta/TaN bilayered film, a TaCN film, a W film, a WN film, a WCN film, a Zr film, a ZrN film, a V film, a VN film, a Mb film, and a NbN film.

* * * * *